Jan. 27, 1959 N. E. LINDENBLAD 2,870,610
THERMOELECTRIC HEAT PUMPS
Filed July 25, 1955 2 Sheets-Sheet 1

INVENTOR.
Nils E. Lindenblad
BY Morris A. Rabkin
ATTORNEY.

Jan. 27, 1959

N. E. LINDENBLAD 2,870,610

THERMOELECTRIC HEAT PUMPS

Filed July 25, 1955

2 Sheets-Sheet 2

INVENTOR.
Nils E. Lindenblad
BY

ATTORNEY.

United States Patent Office 2,870,610

Patented Jan. 27, 1959

2,870,610

THERMOELECTRIC HEAT PUMPS

Nils E. Lindenblad, Princeton, N. J., assignor to Radio Corporation of America, a corporation of Delaware Application July 25, 1955, Serial No. 524,042

5 Claims. (Cl. 62—3)

The present invention relates to thermoelectric heat pumps, and more particularly to improvements in thermoelectric heat pumps which produce cooling by means of the Peltier effect.

Two dissimilar thermoelectric materials, having different thermoelectric powers, may be joined together to form a thermocouple. One junction between the materials becomes cool while the other junction becomes hot, when a current is passed through the materials. This phenomenon is the Peltier effect. When a plurality of bodies of dissimilar thermoelectric materials are arranged in an array in which hot and cold junctions are segregated, a heat pumping device known as a thermopile is provided. Heat will be absorbed by the cold junctions and liberated at the hot junctions. The hot junctions may be arranged on one side of the thermopile and the cool junctions on the opposite side.

The practicability of thermoelectric heat pumps in cooling systems is predicated to a large extent upon achieving optimum efficiency of operation. Greater efficiency is obtained by increasing the heat absorbing capacity of the cold junctions. The present invention affords an improvement in the operating efficiency of thermoelectric heat pumps by increasing this heat absorbing capacity.

During the operation of thermoelectric heat pumps the cold junctions may absorb heat not only from the ambient, but, also, due to conduction through the thermoelectric material, from the hot junctions. Joule heat due to ohmic losses in the thermoelectric material is also conducted to the cold junctions. The capacity of the cold junctions to absorb heat from the ambient is thereby decreased because of this additionally absorbed waste heat. The maximum temperature differential possible with given thermoelectric materials, also, is not obtained.

In accordance with the present invention, heat conduction through the bodies of thermoelectric material to the cold junctions is controlled and minimized by channeling cooling fluid in heat exchange relationship with a relatively small section of the bodies of thermoelectric material. This section may be on the surface of each body and is located in the vicinity of the cold junctions. The cooling fluid used for this purpose may be precooled by means of additional thermoelectric heat pumps which operate in the usual manner.

It is an object of the present invention to provide improved thermoelectric heat pumps.

It is a further object of the present invention to increase the efficiency of thermoelectric heat pumps.

It is a still further object of the present invention to obtain greater cooling effects with thermoelectric heat pumps.

It is a still further object of the present invention to control the absorption of heat that is conducted through bodies of thermoelectric material in a thermocouple.

Other objects and advantages of the present invention will, of course, become apparent and immediately suggest themselves to those skilled in the art to which the invention is directed from a reading of the following specification in connection with the accompanying drawing in which.

Figure 1:
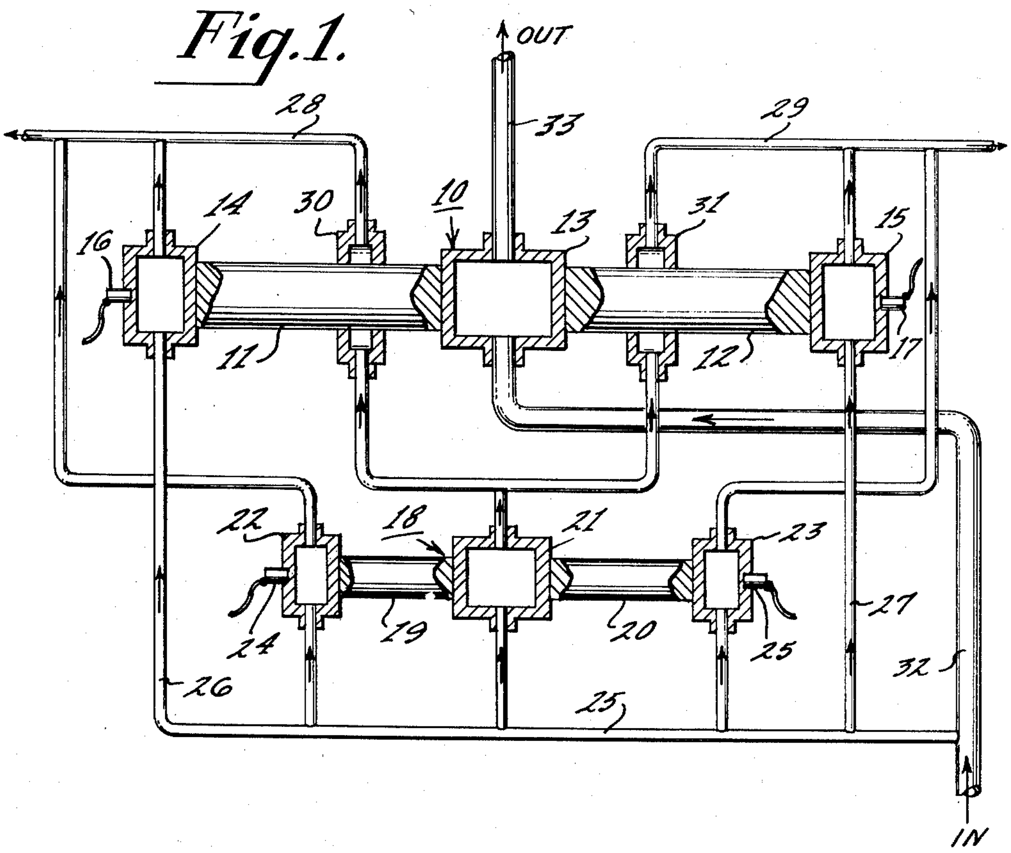
Fig. 1 is a schematic diagram illustrating the present invention in a simplified form.

In Fig. 1 there is shown a cooling system utilizing the present invention. A first thermocouple 10 is formed by two cylindrical bodies 11 and 12 composed of materials having dissimilar thermoelectric properties which are connected at opposite ends of a block 13. This block 13 is constructed from thermally and electrically conductive material such as copper. Bismuth may be used, for example, to make one of the bodies 11 and antimony may be used, for example, in the other body 12. Additional blocks 14 and 15 of thermally and electrically conductive material, such as copper, are attached to the opposite ends of the cylindrical bodies 11 and 12, respectively.

According to the Peltier effect, the junction between the dissimilar thermoelectric materials forming a thermocouple becomes cold when direct current is passed through the thermocouple in one direction. The junction between the dissimilar thermoelectric materials becomes hot when direct current is passed in the reverse direction. In this illustrative example, the block 13 becomes cold if direct current is passed through the thermocouple by a source of electric current (not shown) from a terminal 16 connected to the block 14 on one end thereof to a terminal 17 connected to the block 15 on the opposite end thereof. It is further assumed in the present illustrative example that the material forming the body 11 located on the left is bismuth and the material forming the other block 12 is antimony. The blocks 14 and 15 disposed on the ends of the thermocouple will then become hot. In order to cool these blocks 14 and 15, a cavity is formed therein for the passage of cooling fluid.

Another thermocouple 18 is provided in the illustrated thermoelectric cooling system. This thermocouple may be similar to the first thermocouple described above and includes a pair of cylindrical bodies 19 and 20 formed of dissimilar thermoelectric materials. These cylindrical bodies 19 and 20 are joined together at opposite ends of a block 21 of thermally and electrically conductive material, such as copper. The opposite ends of the thermoelectric cylinders 19 and 20 are connected to blocks 22 and 23 of a material, such as copper. Terminals 24 and 25 project from the blocks 22 and 23, and provide for the connection of a source of electric current (not shown) across the thermocouple 18.

A system of conduits for distributing heat transfer fluids between the thermocouples 10 and 18 is provided. The fluid used may be water, for example. An inlet distribution pipe 25 is connected to the source of this fluid. The fluid is introduced under pressure to the inlet end of this pipe 25. Several pipes connect to the inlet distribution pipe 25. Two of these pipes 26 and 27 circulate the fluid through cavities provided in the copper blocks 14 and 15 which are located at the hot ends of the first thermocouple 10. The water cools these blocks 14 and 15 which become hot during the operation of the thermocouple 10. After circulation through the blocks 14 and 15, the heated water enters different ones of a pair of waste pipes 28 and 29. Water is also circulated through the hot blocks 22 and 23 at the opposite ends of the second thermocouple 18 for purposes of cooling these blocks. The heated water is then piped to the waste pipes 28 and 29 and removed.

In accordance with the present invention, the bodies of thermoelectric material 11 and 12 forming the thermocouple 10 are cooled at particular sections thereof. Cooling is provided by auxiliary cooling devices 30 and 31. These devices may be hollow disks which are fitted in watertight fashion around small sections of the cylindrical bodies 11 and 12. These disks function as water jackets and permit a cooling fluid to be maintained in thermal contact with the surface area of the small section on the bodies 11 and 12. It has been found desirable to locate these cooling devices 30 and 31 at sections of the bodies 11 and 12 nearer to the cold junction block 13 than to the warm-end junction blocks 14 and 15.

In order to provide cooling fluid for circulation through the hollow disks 30 and 31, the fluid from the inlet pipe 25 is precooled. Precooling is provided by the thermocouple 18. Fluid from the inlet pipe 25 is piped through a cavity provided in the central block 21 which forms the cold junction of the second thermocouple 18. After circulating through the cavity in this cold block 21, the precooled fluid is passed through the cooling devices 30 and 31 on the first thermocouple 10. Outlet fluid from the cooling device 30 is removed by way of one of the waste pipes 28 and cooling fluid from the other cooling device 31 is removed by way of the other waste pipe 29.

If desired, a cavity may be formed in the central cold block 13 of the first thermocouple 10. Fluid to be cooled may be passed in heat exchange relationship with the block 13. This fluid may be obtained directly from the inlet by way of a distribution pipe 32 connected to the cavity in the block 13 or sometimes the fluid may be more advantageously obtained from a branch (not shown) of the pipe system coming from the center block 21 on the other thermocouple 18. This may be done when great temperature drops are desired but when the loading of the system is relatively light. Since the block 13 is quite cold and may have a temperature difference of more than 35° centigrade with respect to the ambient temperature, the inlet fluid is cooled appreciably and may be piped through an outlet pipe 33. The outlet pipe 33 may be connected to a refrigerating or air conditioning apparatus, for example. However, the block 13 may be physically exposed to the ambient to absorb heat therefrom and the piping dispensed with. For example, the copper block 13 may be used as the active heat absorbing element instead of an evaporator in a refrigerator or air conditioning device.

Figure 2:
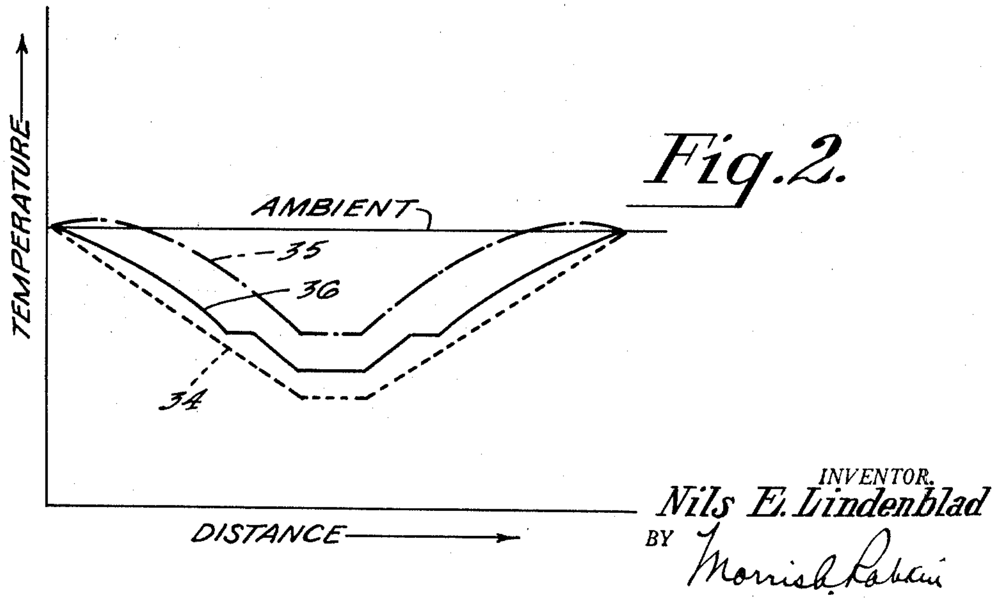
Fig. 2 is a graph of the temperature distribution in a thermocouple which illustrates the improvements provided by the present invention.

In Fig. 2 a graph of the temperature distribution along an individual thermocouple is shown. The abscissa of this graph is calibrated in terms of distance along the length of a thermocouple of the type illustrated by the first thermocouple 10 in Fig. 1. The zero position corresponds to one of the hot junction ends of the thermocouple. The dashed line 34 illustrates the temperature drop along an ideal thermocouple of the illustrated type. It may be observed that the temperature drop is maximum at the cold junction. However, this idealized condition is not achieved in practical thermocouples. A more likely temperature distribution is illustrated by the line 35 made up of long and short dashes. It may be observed that the maximum temperature differential obtainable is less than in the idealized case. This is due primarily to heat conduction from the hot junction to the cold junction along the bodies of thermoelectric material. Another contributing factor to the decreased temperature differential is the ohmic losses or Joule heat generated in the bodies of thermoelectric material by the passage of current therethrough. Since the Joule heat generated is distributed and integrates along its flow path, the temperature distribution illustrated by the upper curve 35 is slightly parabolic in shape.

The present invention permits a larger temperature drop at the cold junction of the thermocouple than was heretofore available by absorbing a part of the heat that is conducted along the bodies of thermoelectric material and which would otherwise be absorbed by the cold junction. The solid line curve 36 illustrates the improvement in temperature differential which may be provided by the present invention. The cooling devices located on the bodies of thermoelectric material stabilize the temperature at the part of the body to which the device is connected thereby causing symmetrically disposed plateaus on the curve. Since a cooling fluid is circulating in heat transfer relationship with the body, the conducted heat due to the hot junction and the ohmic losses is to a significant extent absorbed by the fluid. The cold junction may therefore achieve a lower temperature below the ambient temperature than was possible heretofore. The temperature which may be attained by the cold junction is indicated by the lowest horizontal portion of the center curve 36.

The part of the thermoelectric bodies cooled by the cooling devices 30 and 31 will determine the temperature drop at the cold junction. It may be noted that the cooling devices 30 and 31 would be ineffective if they were placed directly adjacent to the cooled junction. The cold junction of the other thermocouple 18 would, then, merely add its heat absorbing capacity to that of the cold junction of the first thermocouple 10 at the same temperature, and its effect upon the temperature drop at the cold junction on block 13 of the first thermocouple 10 would be negligible. It will be observed from the curve 35, which indicates the temperature distribution of a practical thermocouple without the present invention, that the maximum effect from the auxiliary cooling devices 30 and 31 in lowering the temperature of the cold junction 13 may be obtained by positioning these cooling devices at a definite distance from the ends of the cold junction 13. It may be noted that positioning the cooling devices adjacent to the cold junctions, as would be indicated by the plateau of the central curve 36 being positioned adjacent to the region of maximum temperature drop, would provide no further temperature drop. It has been found, however, that the disposition of each of the cooling devices 30 and 31 closer to the cold junction than to a hot junction as indicated on the graph provides the maximum cooling effect and maximum temperature drop.

Figure 3:
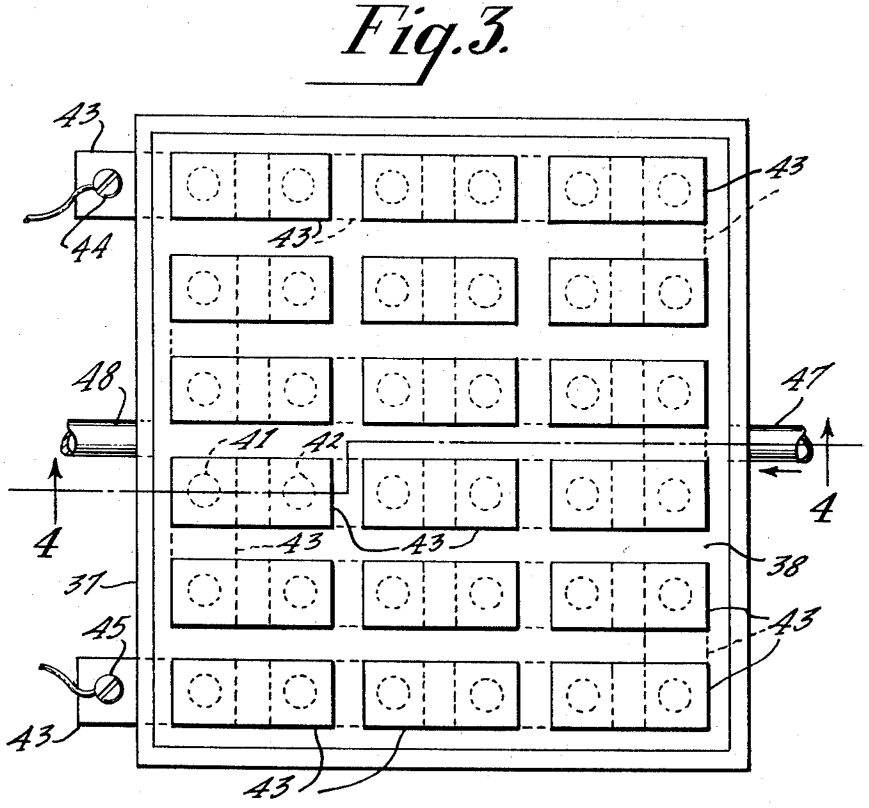
Fig. 3 is a plan view of a panel thermopile structure which utilizes the improvements afforded by the present invention.
Figure 4:
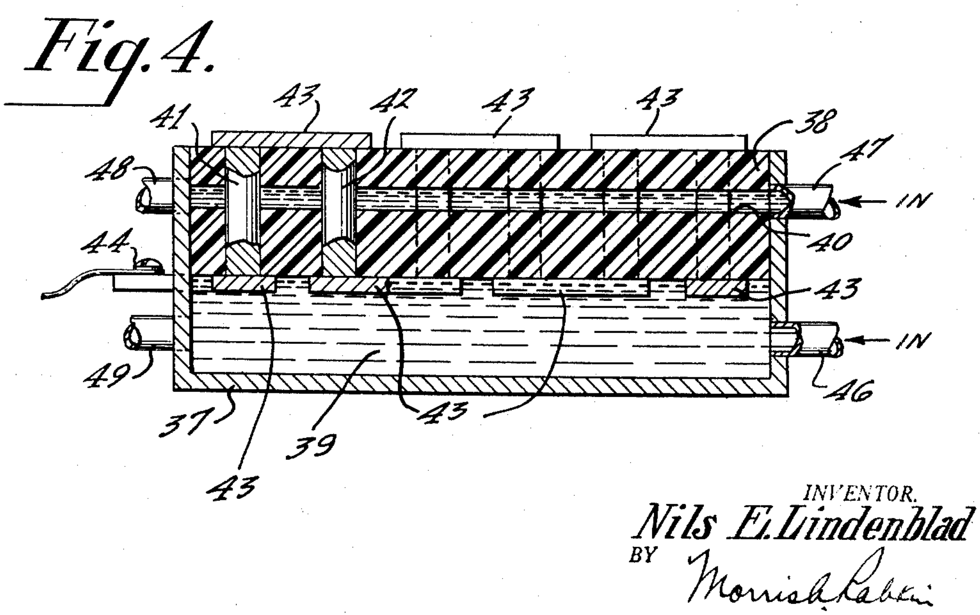
Fig. 4 is a sectional view of Fig. 3, the section being taken along the line 4—4 as viewed in the direction of the arrows.

Figs. 3 and 4 illustrate a panel thermopile structure which includes a form of the present invention. The thermocouples comprising the panel structure are disposed in a container 37. The container 37 is partially filled by two layers of thermally and electrically insulating material 38. A chamber 39 is formed in the bottom of the container 37 by this lower layer of insulating material 38. The two layers of insulating material are separated by a narrow gap 40. This gap defines a passageway through which a cooling fluid may be circulated, as will be later brought out.

Holes are provided in the insulating material 38 into which rods or plugs of thermoelectric materials may be inserted. Rods made of dissimilar thermoelectric materials may be placed in alternate sequence in the holes in the insulating material 38. As shown in the sectional view of Fig. 3, the rod 41 is made of a first thermoelectric material while the rod 42 adjacent thereto is made of second, dissimilar thermoelectric material. Dissimilar thermoelectric materials when joined to form a junction may, depending upon the current direction, produce heating or cooling in accordance with the Peltier effect, as previously described.

Strips 43 of thermally and electrically conductive materials are arranged on the upper and lower ends of the matrix of thermoelectric rods. These strips 43 join pairs of the dissimilar thermoelectric rods. The connecting strips 43 on the upper side of the matrix are disposed above the surface of the upper layer of insulating material 38. The group of linking strips 43 connecting the bottom ends of pairs of dissimilar thermoelectric rods are located below the insulating material 38. It may also be observed that the rods of thermoelectric material project through the gap 40 formed between the layers of insulating material 38.

The rods of dissimilar thermoelectric material are connected in series, as may be observed, by the strips 43 of conducting material at the upper and lower levels. Terminals 44 and 45 are connected to one of the strips 43 at the beginning and to another one of the strips 43 at the end of the interconnected thermoelectric rods. A source of electric current may be connected across these terminals 44 and 45 in a manner such that current flows through the thermoelectric rods and the interconnecting strips 43 to provide cold junctions at the strips located in the upper level and hot junctions located in the lower level. The direction of current flow through the interconnected rods determines whether the strips 43 in the upper or lower level of the matrix will provide the hot junctions or the cold junctions. Therefore, the current direction is selected so that the strips 43 on the upper side of the matrix provide the cold, heat absorbing junctions. To carry away the heat from the hot strips 43 of the lower level of the matrix a cooling fluid such as water may be circulated in the chamber 39 in the container 37. Water may be made to enter the chamber 39 through an inlet pipe 46. An outlet pipe 44 which is connected to the chamber 39 may be provided. A cooling fluid, which may be precooled by a thermoelectric cooling system, for example, is circulated through the gap 40 to cool the rods of dissimilar thermoelectric material near the cold junctions at the strips 43 in the level. An inlet pipe 47 and an outlet pipe 48 are connected to introduce and remove the circulating, cooling fluid from the gap 40. By cooling the thermoelectric rods in the panel thermopile, in accordance with the present invention, greater efficiency, effectiveness of operation and lower temperatures in the cold strips 43 are provided. A panel, such as described in connection with Figs. 3 and 4, may be incorporated in a wall of a room to provide cooling of the room. Alternatively, such a structure may be used in a refrigerator.

The present invention provides greater efficiency and lower temperatures from thermoelectric heat pumps and may be applied to the other forms of heat pumps than those described for purposes of illustration herein.

What is claimed is:

1. A thermoelectric heat pump comprising a number of bodies, some of said number being formed of material having dissimilar thermoelectric properties from the material of the other of said number, junction means joining said bodies of dissimilar thermoelectric material in a series-connected chain to provide alternate hot and cold junctions therebetween, a number of auxiliary cooling devices, said number being equal to the number of said bodies, each of said devices having a dimension in length smaller than the length of any of said bodies, each of said devices having a channel therein for the passage of a cooling fluid therethrough, each of said devices being disposed on a different one of said bodies at a location thereon closer to said cold junctions than to said hot junctions, and means for circulating said cooling fluid through said channels in each of said bodies.

2. A thermoelectric heat pump for cooling by means of the Peltier effect comprising a plurality of dissimilar thermoelectric elements with adjacent ends thereof disposed in electrical contact, said elements thereby forming alternate hot and cold junctions therebetween, a plurality of cooling members having a dimension in length many times smaller than the dimension in length of said elements, said members being disposed each around different ones of said elements at a location of said elements nearer to the said cold junction end thereof than to said hot junction end thereof, each of said members having annular channel therein extending circumferentially around the element associated therewith, and means for circulating a cooling fluid through said channels whereby said cold junctions are part thermally isolated from said hot junctions.

3. A thermoelectric cooling system comprising a thermocouple, said thermocouple including a block of thermally and electrically conductive material and two bodies of dissimilar thermoelectric materials joined together at opposite ends of said block, means for passing an electric current through said thermocouple to form a cold junction at said block, means for precooling liquid fluids, annular jackets for containing said cooling fluid disposed around each of said bodies, and said jackets being disposed around predetermined surface areas of said bodies, said areas being located nearer the ends of said bodies joined to said block than to the ends of said bodies opposite said joined ends, and conduits extending into and out of each of said jackets for circulating said precooled cooling fluid and heat exchange relationship with said surface areas.

4. The cooling system, according to claim 3 wherein said precooling means comprises a second thermocouple having a cold junction, and said circulating means comprising means for connecting said conduits to said cold junction of said second thermocouple for passing said cooling fluid in heat exchange relationship with said cold junction of said second thermocouple.

5. A panel thermopile structure comprising a plurality of strips of thermally and electrically conductive materials disposed at two separate levels, a matrix of elongated bodies of dissimilar thermoelectric materials connected alternately at opposite ends thereof to different ones at said strips in each of said levels, said strips in one of said levels providing cold junctions and said strips in the other said levels providing hot junctions in said thermopile, a first layer of insulating material, a second layer of insulating material, each of the layers being disposed between said strips and spaced from each other to define an opening therebetween, said opening being located closer to said strips providing said cold junctions than to said strips providing said hot junctions, and conduits for circulating a cooling fluid through said opening in heat exchange relationship with said bodies.

References Cited in the file of this patent

UNITED STATES PATENTS

| | | |
|---|---|---|
| 413,136 | Dewey | Oct. 15, 1889 |

FOREIGN PATENTS

| | | |
|---|---|---|
| 414,126 | Austria | Oct. 6, 1927 |